United States Patent
Horii et al.

(10) Patent No.: US 7,495,456 B2
(45) Date of Patent: Feb. 24, 2009

(54) SYSTEM AND METHOD OF DETERMINING PULSE PROPERTIES OF SEMICONDUCTOR DEVICE

(75) Inventors: Hideki Horii, Seoul (KR); Yong-Ho Ha, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 194 days.

(21) Appl. No.: 11/361,412

(22) Filed: Feb. 24, 2006

(65) Prior Publication Data

US 2006/0267573 A1    Nov. 30, 2006

(30) Foreign Application Priority Data

May 24, 2005    (KR) ...................... 10-2005-0043812

(51) Int. Cl.
*G01R 27/08* (2006.01)
(52) U.S. Cl. .................. 324/713; 324/769; 702/65; 257/200; 714/8
(58) Field of Classification Search .................. 324/713
See application file for complete search history.

(56) References Cited

U.S. PATENT DOCUMENTS

| | | | | |
|---|---|---|---|---|
| 5,905,384 | A * | 5/1999 | Inoue et al. ................. | 324/769 |
| 6,965,838 | B1 * | 11/2005 | Bandholz ..................... | 702/65 |
| 2004/0068674 | A1 * | 4/2004 | Rodriguez et al. ............ | 714/25 |
| 2004/0245547 | A1 * | 12/2004 | Stipe .......................... | 257/200 |
| 2007/0094534 | A1 * | 4/2007 | Andreev et al. ................ | 714/8 |

OTHER PUBLICATIONS

Tektronix Digital Storage Oscilloscopes, TDS1000B series, TDS2000B Series, Specifications/ Data Sheet, Jun. 2006.*
Down East Microwave Inc. DEM SSBT Safety Switch Bias Tee Data Sheet, Apr. 8, 2002.*
Agilent Technologies model 4076 Press Release (Mar. 14, 2005); Agilent Technologies Model 4076 Ultra Advanced DC/RF/Pulse Parametric Tester Data Sheet, Printed Oct. 15, 2007.*
Agilent Technologies Infiniium 54830 Series Oscilloscopes Data Book/Features, Printed Nov. 17, 2004.*
English language abstract of Korean Publication No. 2004-0104969.
English language abstract of Korean Publication No. 2005-0020356.
English language abstract of Japanese Publication No. 11-102600.
Down East Microwave Inc., DEM Part Number SSBT data sheet, publication date Apr. 8, 2002, 1 page.

* cited by examiner

*Primary Examiner*—Vincent Q Nguyen
*Assistant Examiner*—Benjamin M Baldridge
(74) *Attorney, Agent, or Firm*—Marger Johnson & McCollom, P.C.

(57) ABSTRACT

Provided are a system and method of determining pulse properties of a semiconductor device. An embodiment of the system includes at least one pair of first and second probes electrically contacting terminals of the semiconductor resistance device, a pulse generator connected to the first probe and outputting pulse signals, an oscilloscope having at least one pair of first and second channels, wherein the pulse electric signal is supplied to the first channel and the first probe and the second channel is connected to the second probe. The oscilloscope calculates a pulse current flowing in terminals of the semiconductor resistance device using the second channel and determines a dynamic resistance of the semiconductor resistance device using the first and second channels.

27 Claims, 8 Drawing Sheets

SYSTEM AND METHOD OF DETERMINING PULSE PROPERTIES OF SEMICONDUCTOR DEVICE

CROSS-REFERENCE TO RELATED PATENT APPLICATION

This application claims the benefit of Korean Patent Application No. 10-2005-0043812, filed on May 24, 2005, in the Korean Intellectual Property Office, the disclosure of which is incorporated herein in its entirety by reference.

BACKGROUND OF THE INVENTION

1. Field of the Invention

The present invention relates to a system and method of determining properties of a semiconductor resistance device, and more particularly, to a system and method of determining pulse properties of a semiconductor resistance device.

2. Description of the Related Art

Methods of determining the operating properties or estimating the reliability of semiconductor resistance devices have been researched. For example, methods of determining resistance and current changes in a resistance random-access memory (RRAM), which stores data bits using resistance changes, and in a resistance switch have been researched. A phase change random-access memory (PRAM), a magnetic random-access memory (MRAM), an oxide random-access memory (OxRAM), etc. are all types of RRAMs whose resistances can be dynamically changed with respect to changes in an applied electric signal. Examples of the resistance switch are a CuS switch, which uses migration of CuS, and a chalcogenide switch, which uses a chalcogenide material like GeSbSe.

High-speed semiconductor resistance devices need to determine properties corresponding to high frequency signals in RRAMs and also corresponding to resistance switches. For example, the high frequency pulse properties of RRAM can be determined using a high frequency pulse generator. The pulse properties are, for example, resistance and current properties.

FIGS. 1 through 3 illustrate the results of determining the properties of a PRAM using a pulse voltage generator and a current-voltage meter. FIG. 1 is a graph showing program resistances with respect to various pulse voltages, which are determined by a conventional method of determining properties of a resistance memory device. FIG. 2 is a graph showing relations of direct current (DC) currents versus DC voltages determined using a current-voltage meter according to a conventional method of determining properties of a resistance memory device. Changes in resistance (hereinafter, referred to as a program resistance $R_p$) with respect to a pulse voltage ($V_p$) after operating a set or reset program are shown in FIG. 1. A threshold voltage and reset current of a PRAM can be determined based on the results shown in FIG. 1. To obtain a program resistance $R_p$ of a PRAM, it is necessary to perform a two-step operation, such as applying a pulse voltage $V_p$ and applying a direct current (DC) voltage $V_D$, which is used to determine DC current $I_D$, as shown in FIG. 2.

FIG. 3 is a graph illustrating program resistance changes of a resistance memory device, which are caused by applying a DC current according to a conventional method of determining properties of a resistance memory device. When a pulse voltage and a DC voltage are alternately applied on a PRAM using one apparatus, a switch device, for example, a radio frequency (RF) switch, is necessary, and thus a pulse current $I_p$ flowing in the PRAM cannot be simultaneously determined while applying a pulse voltage $V_p$. A current-voltage meter should be used for determining a reset current of the PRAM, and thus a high voltage (for example, about 2 V) that is greater than a threshold voltage of the PRAM should be applied to the PRAM. Here, the PRAM is stressed by the applied high voltage and damaged, resulting in a significant change in the relationship between the pulse current and the program resistance $R_p$. The results based on the first measurement (●) and the second measurement (□) are shown in FIG. 3, and the results of each measurement show a significant difference in the relationships between the program resistance $R_p$ and the pulse current $I_p$.

In addition, the resistance of the PRAM while applying a pulse voltage (referred to as a dynamic resistance $R_d$) cannot be determined. That is, a dynamic change in an interface between a phase change film and a lower electrode is unknown during PRAM operations.

SUMMARY OF THE INVENTION

The present invention provides a system of determining pulse properties of a semiconductor resistance device, and more particularly, a system for determining pulse currents and dynamic resistances in real time.

The present invention also provides a method of determining pulse properties of a semiconductor resistance device, and more particularly, a feed-back determination method allowing limitations to be established using the pulse current.

According to an embodiment of the present invention, a system of determining pulse properties of a semiconductor resistance device includes a first and a second probe electrically contacting the terminals of the semiconductor resistance device. The system also includes a pulse generator to supply a pulse electric signal to the first probe, and an oscilloscope having a first and a second channel. In the system, the pulse electric signal is supplied to the first channel and the first probe and the second channel is connected to the second probe. The oscilloscope calculates a pulse current flowing in terminals of the semiconductor resistance device using the second channel and determines a dynamic resistance of the semiconductor resistance device using the first and second channels.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
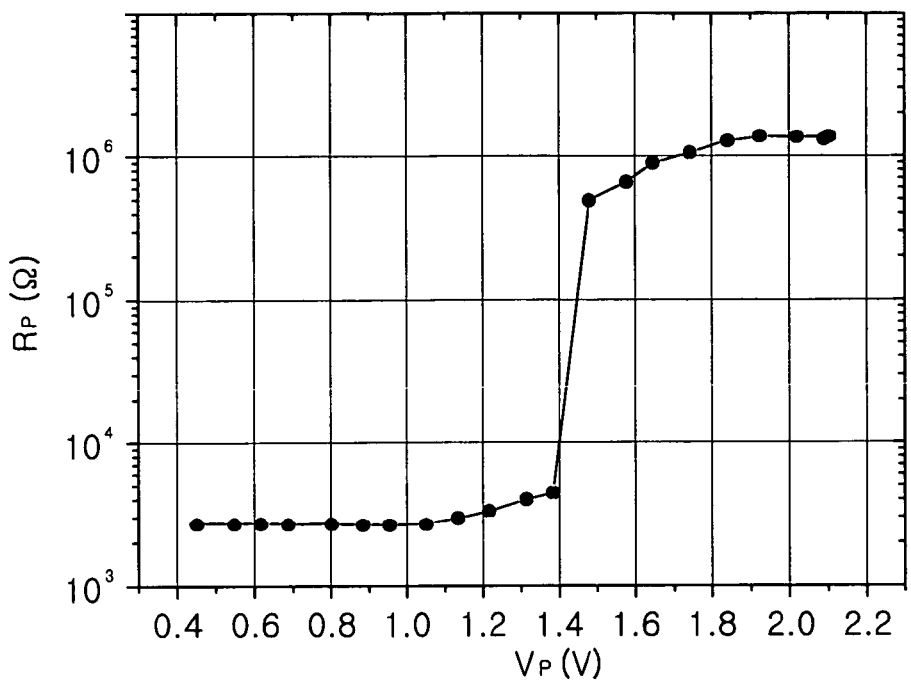
FIG. 1 is a graph showing program resistances with respect to various pulse voltages, which are determined by a conventional method of determining properties of a resistance memory device.
Figure 2:
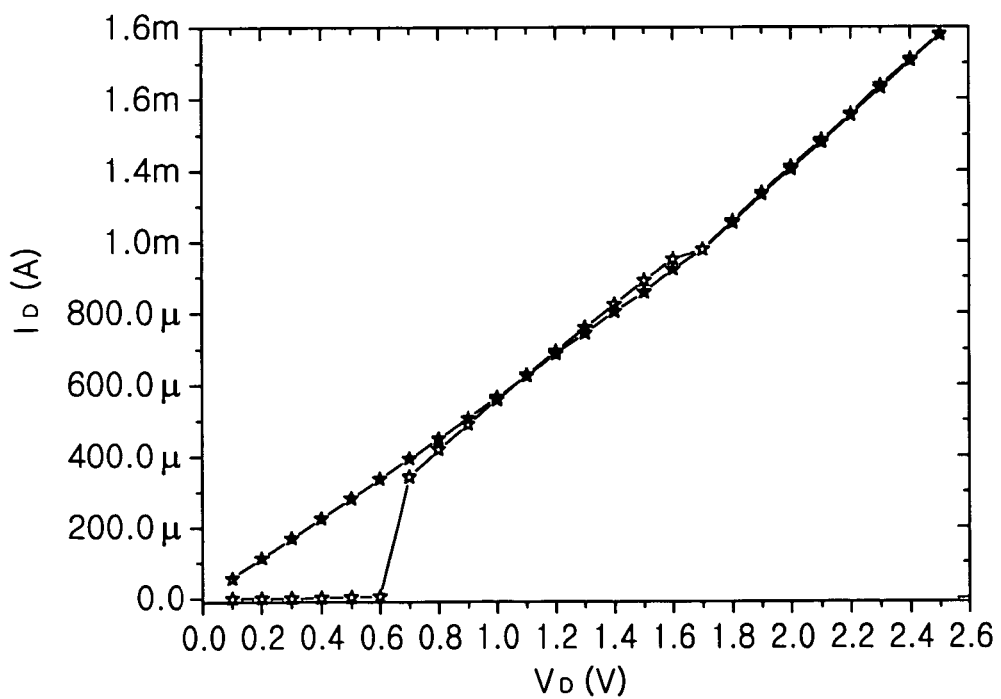
FIG. 2 is a graph showing relations of direct current (DC) currents versus DC voltages determined using a current-voltage meter according to a conventional method of determining properties of a resistance memory device.
Figure 3:
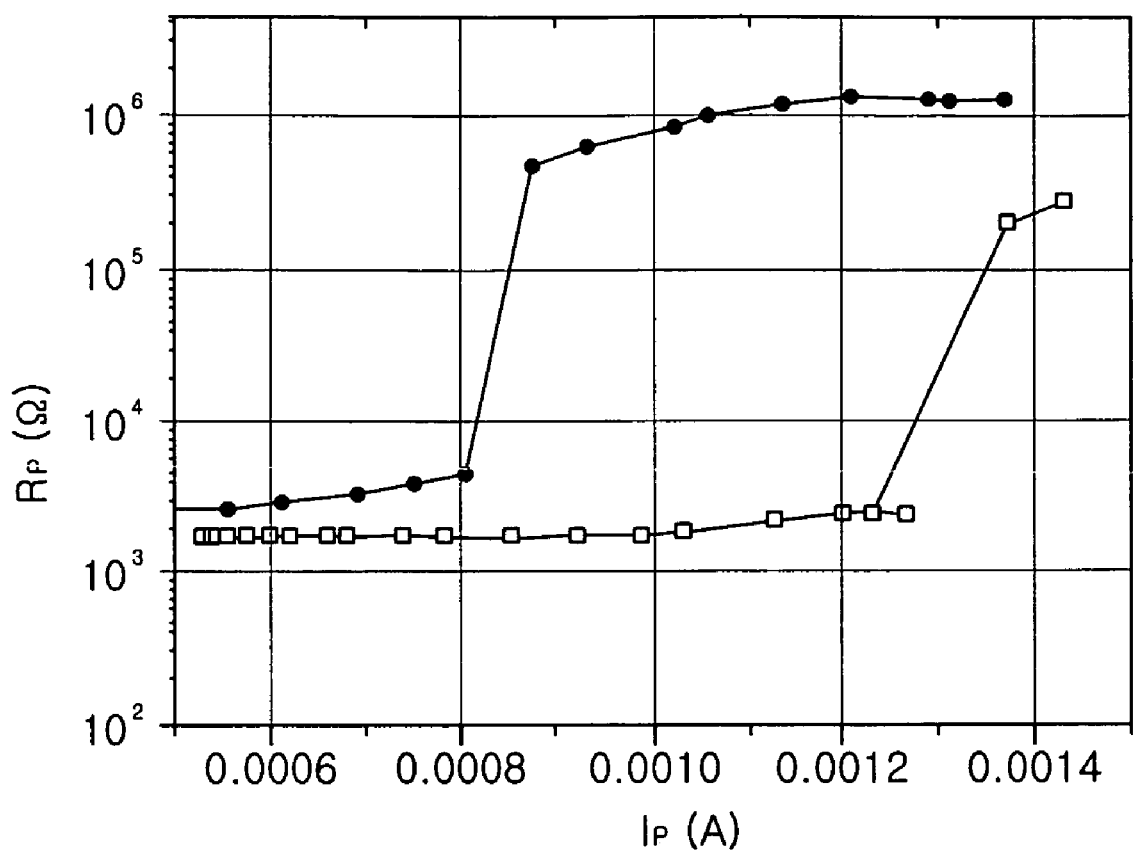
FIG. 3 is a graph illustrating program resistance changes of a resistance memory device, which are caused by applying a DC current according to a conventional method of determining properties of a resistance memory device.

The present invention will now be described more fully with reference to the accompanying drawings, in which exemplary embodiments of the invention are shown. The invention may, however, be embodied in many different forms and should not be construed as being limited to the embodiments set forth herein; rather these embodiments are provided so that this disclosure will be thorough and compete, and will fully convey the concept of the invention to those skilled in the art. In the drawings, the thicknesses of layers are regions are exaggerated for clarity.

Figure 4:
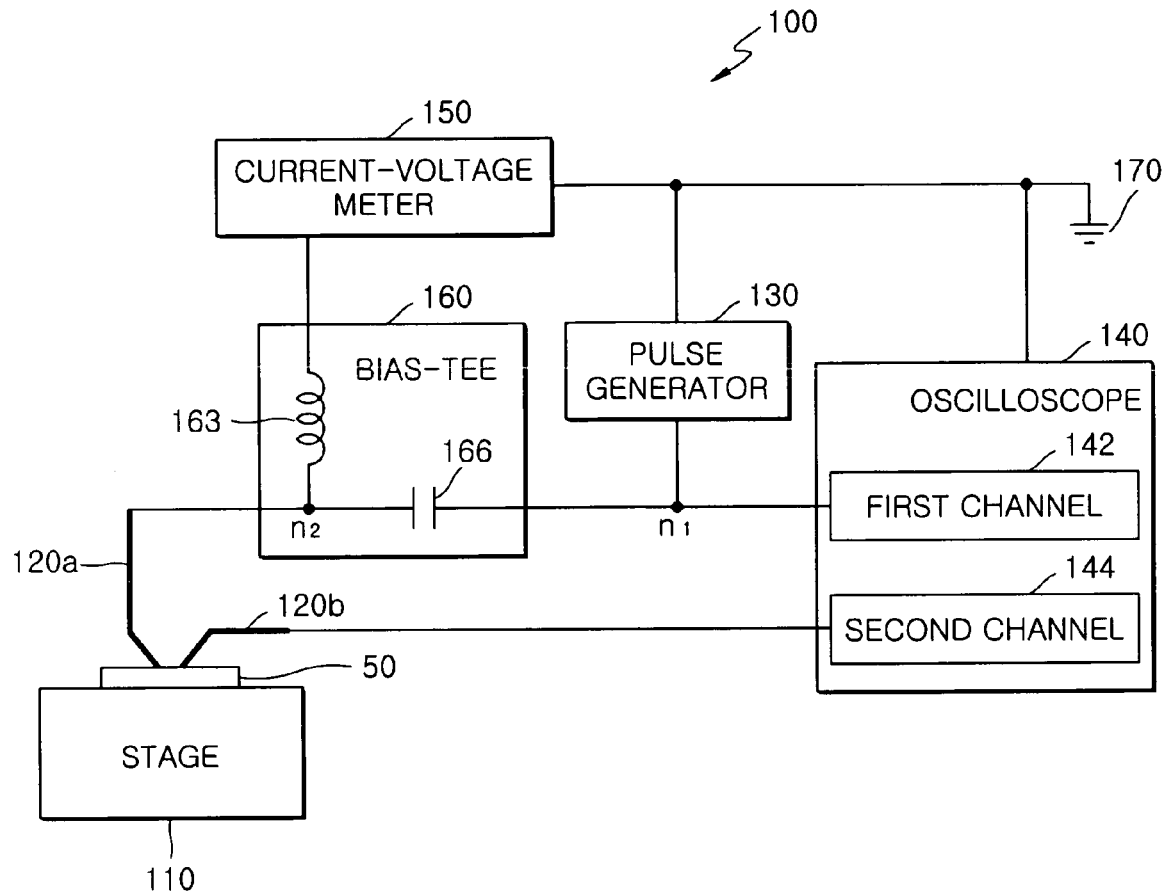
FIG. 4 illustrates a system of determining pulse properties of a semiconductor device according to an embodiment of the present invention.

FIG. 4 illustrates a system of determining pulse properties according to an embodiment of the present invention. Referring to FIG. 4, the system 100 includes a pulse generator 130, an oscilloscope 140, probes 120a and 120b, a current-voltage meter 150, a bias tee 160, and a stage 110.

A semiconductor resistance device 50 is mounted on the stage 110. The semiconductor resistance device 50 may be, for example, a resistance random-access memory (RRAM) storing information using resistance changes, or a resistance switch using resistance changes. At least one pair of probes, i.e. first and second probes 120a and 120b, electrically contacting terminals (not illustrated) of the semiconductor resistance device 50 are provided above the stage 110. The probes 120a and 120b made of, for example, conductive metals, may have sharp ends to allow them to contact terminals formed of micro-patterns on the semiconductor resistance device 50. One of the probes 120a and 120b may be connected to a ground 170. Besides the probes 120a and 120b, additional probes to monitor voltages or currents may be included.

The pulse generator 130 generates a pulse signal, for example a pulse voltage or a pulse current. A pulse voltage can be used as a high frequency pulse signal. The pulse generator 130 is connected to the first probe 120a so as to apply a pulse signal to the semiconductor resistance device 50, and to the ground 170.

The oscilloscope 140 monitors an output voltage of the pulse generator 130 and a voltage drop in the semiconductor resistance device 50. The oscilloscope 140 has at least two channels 142 and 144. The first channel 142 is connected in parallel to the pulse generator 130 and the first probe 120a through a first node $n_1$. Accordingly, a pulse voltage from the pulse generator 130 is transmitted to the first probe 120a and the first channel 142. The second channel 144 is connected to the second probe 120b. The channels 142 and 144 are also connected to ground 170 via internal connections of the oscilloscope 140. Accordingly, a first circuit is formed to have the pulse generator 130, the probes 120a and 120b, and the second channel 144, and a second circuit is formed to have the pulse generator 130 and the first channel 142. The current flowing in the first circuit while applying the pulse voltage is the pulse current ($I_p$) flowing in the semiconductor resistance device 50. For the purposes of this application, the current-voltage meter 150 is taken to be both a source of voltage and current, (i.e. a DC power supply), and a measurement instrument to measure voltage, current and resistance, as is commonly used in the art.

Figure 5:
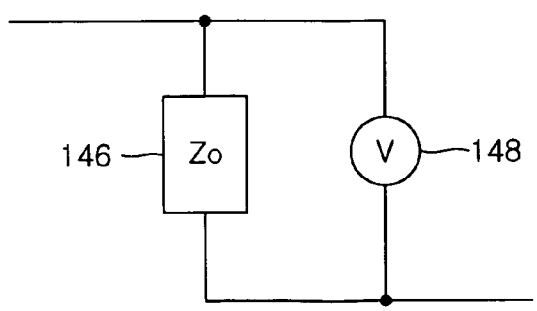
FIG. 5 is a circuit diagram of a channel in the oscilloscope illustrated in FIG. 4.

FIG. 5 is a circuit diagram of a channel in the oscilloscope illustrated in FIG. 4. The internal structure of the channels 142 and 144 will be described in detail with reference to FIG. 5, wherein each of the channels 142 and 144, whose structures are similar to each other, has an internal impedance $Z_o$ 146 and a voltage meter 148 connected to each other in parallel. Since the value of an internal resistance (not illustrated) of the voltage meter 148 is assumed to be infinitely large, the current flows only via the internal impedance $Z_o$ 146 in the channels 142 and 144, and thus the voltage meter 148 indicates a voltage drop between the ends of the internal impedance $Z_o$ 146.

Accordingly, a first voltage $V_1$ monitored using the first channel 142 is equivalent to the voltage at the first probe 120a and a second voltage $V_2$ monitored using the second channel 144 is equivalent to the voltage at the second probe 120b. Thus, a voltage drop in the semiconductor resistance device 50 is equivalent to a difference between $V_1$ and $V_2$. A pulse current $I_p$ and dynamic resistance $R_d$ while applying a pulse voltage to the semiconductor resistance device 50 are determined by the following formulas:

$$I_p = V_2/Z_o \quad (1)$$

wherein $Z_o$ is less than 1000 Ω, and preferably, about 50 Ω.

$$R_d = (V_1 - V_2)/I_p \quad (2)$$

Therefore, the system 100 is capable of a real-time determination of the pulse current $I_p$ and the dynamic resistance $R_d$ in a single operation while applying the pulse voltage $V_p$, thereby reducing testing time compared to the conventional method.

The current-voltage meter 150 is an ancillary apparatus for determining a program resistance $R_p$ of each program operation, for example, a set or reset operation of the semiconductor resistance device 50. For example, a phase change random-access memory (PRAM) needs a cooling interval after applying a pulse voltage to perform the set or reset operations in the PRAM. Accordingly, an estimate of the program resistance $R_p$ is necessary for estimating the cooling time in addition to estimating the dynamic resistance $R_d$. For example, the phase change in the PRAM caused by applying a pulse voltage can be detected by the changes in the dynamic resistance $R_d$. If only the pulse current $I_p$ and the dynamic resistance $R_d$ need to be obtained, the current-voltage meter 150 may be omitted.

The current-voltage meter 150 and the pulse generator 130 are connected in parallel to the first probe 120a via the bias tee 160. The bias tee 160 has an alternating current (AC) pass element 166 connected to the pulse generator 130 through the node $n_1$ and a direct current (DC) pass element 163 connected to the current-voltage meter. The AC and DC pass elements 166 and 163 are connected to each other at a node $n_2$. The AC pass element 166 is, for example, a capacitor and the DC pass element 163 is, for example, a coil. A pulse current generated in the pulse generator 130 is conducted by the AC pass element 166, but not by the DC pass element 163. On the other hand, the DC current of the current-voltage meter 150 is conducted by the DC pass element 163, but not by the AC pass element 166. Accordingly, the bias tee 160 performs as a switch.

The other end of the current-voltage meter 150 is connected to the ground 170. The ground 170 may be connected to the second probe 120b via the second channel 144. Accordingly, the internal impedance $Z_o$ of the second channel 144 should be considered when obtaining the program resistance $R_p$ of the semiconductor resistance device 50. However, the second probe 120b may be directly connected to the current-voltage meter 150 and the second channel 144 via an additional switch device (not illustrated) according to modified embodiments of the present invention.

Figure 6:
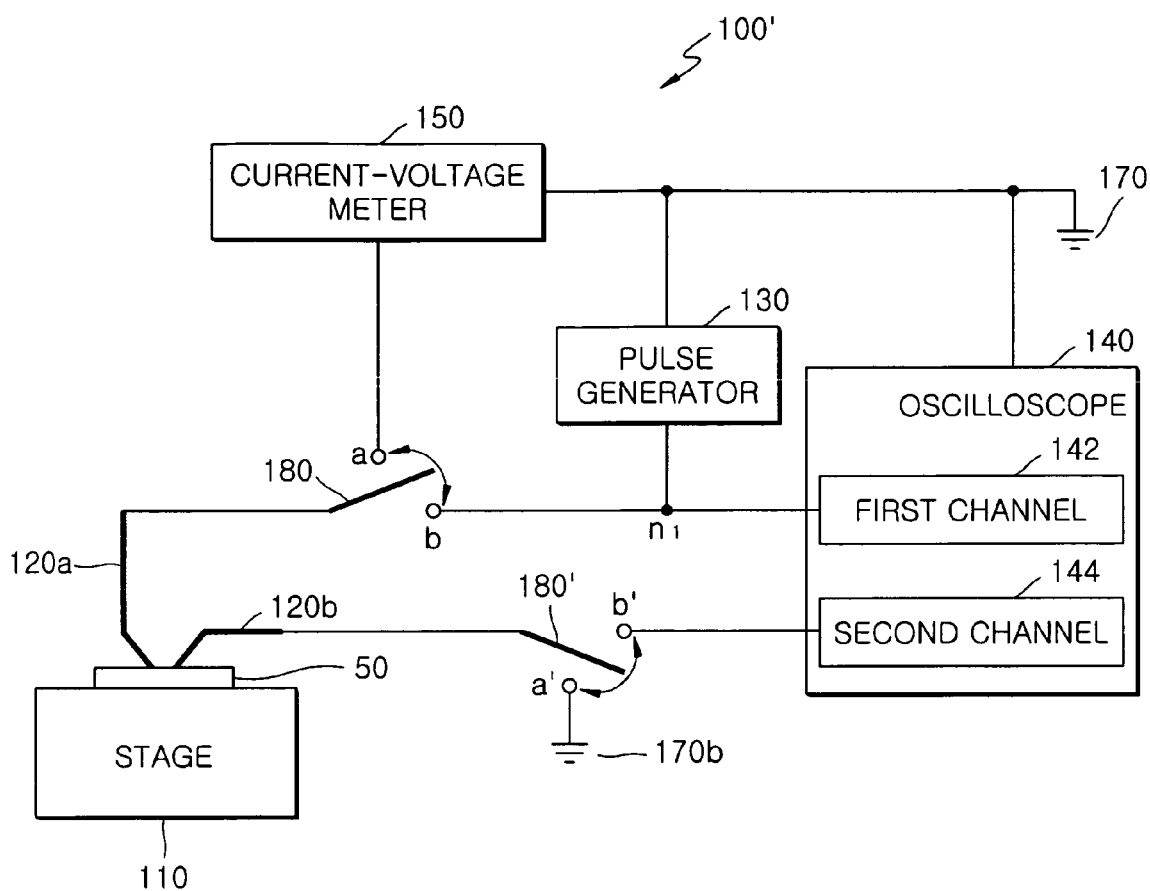
FIG. 6 illustrates a system of determining pulse properties of a semiconductor device according to another embodiment of the present invention.

FIG. 6 illustrates a system of determining pulse properties according to another embodiment of the present invention. Referring to FIG. 6, the system 100' has first and second radio frequency (RF) switches 180 and 180' in lieu of the bias tee 160 in FIG. 5. The description of the system 100' except for the first and second RF switches 180 and 180' is the same as that for the previous descriptions of FIGS. 4 and 5.

The first RF switch 180 alternately connects either one end of a current-voltage meter 150 or one end of a pulse generator 130 to the first probe 120a. The other ends of the current-voltage meter 150 and the pulse generator 130 are connected to a common ground 170. In addition, a second probe 120b is alternately connected between either a second channel 144 or a second ground 170b via the second RF switch 180'.

More specifically, the first RF switch 180 is connected to b and the second RF switch 180' is connected to b' when applying a pulse voltage $V_p$ to determine a pulse current $I_p$ and a dynamic resistance $R_d$. On the other hand, when a program resistance $R_p$ is determined, the first RF switch 180 is connected to a, and the second RF switch 180' is connected to a', thereby connecting the current-voltage meter 150 to a first probe 120a. Here, the first and second RF switches 180 and 180' may simultaneously switch.

Figure 7:
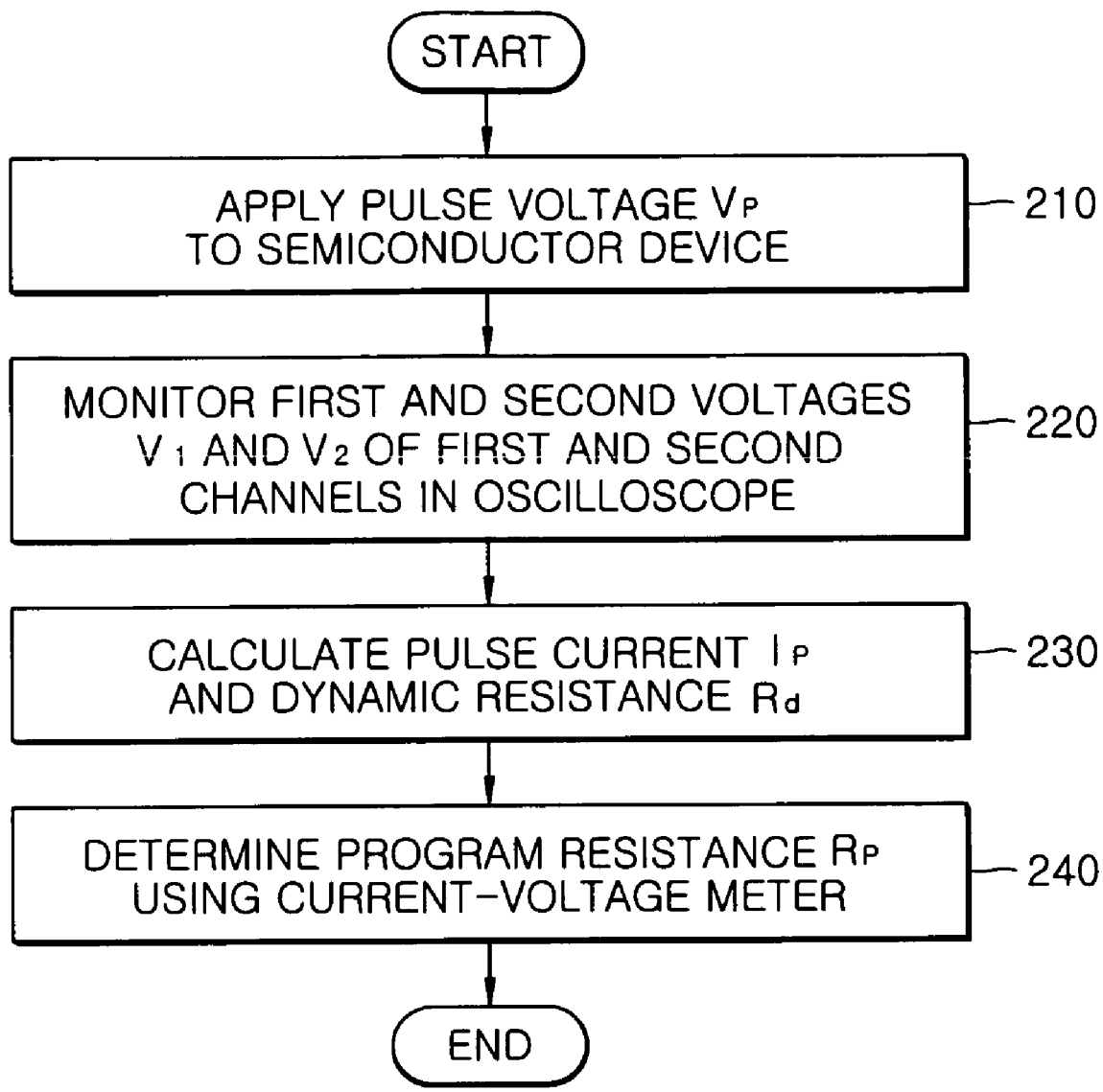
FIG. 7 is a flow chart illustrating a method of determining pulse properties of a semiconductor device according to an embodiment of the present invention.

FIG. 7 is a flow chart illustrating a method of determining pulse properties of a semiconductor resistance device according to an embodiment of the present invention. For a description of a system of determining pulse properties of the semiconductor resistance device reference can be made to the previous descriptions of FIGS. 4 through 6.

Referring to FIG. 7, a pulse voltage generated by the pulse generator 130 is applied to the semiconductor resistance device 50 via, for example, the bias tee 160 (see FIG. 4) or the first RF switch 180, which is connected to b (see FIG. 6), in operation 210.

The first and second voltages $V_1$ and $V_2$ monitored by the first and second channels 142 and 144 in the oscilloscope 140 are monitored in operation 220.

The pulse current $I_p$ and the dynamic resistance $R_d$ is calculated in operation 230. Here, the pulse current $I_p$ can be calculated using formula 1 (listed above) and the dynamic resistance $R_d$ can be calculated using formula 2 (listed above).

Next, the program resistance $R_p$ is determined using the current-voltage meter 150 in operation 240. The program resistance $R_p$ can be determined by measuring a voltage drop between the ends of the semiconductor resistance device 50 when a DC voltage is applied to the semiconductor resistance device 50 by the current-voltage meter 150. Here, the DC voltage is lower than the threshold voltage of the semiconductor device 50, for example, about 0.2V to about 0.4V. Thus, a semiconductor resistance device 50 is not under an electrical stress.

Figure 9:
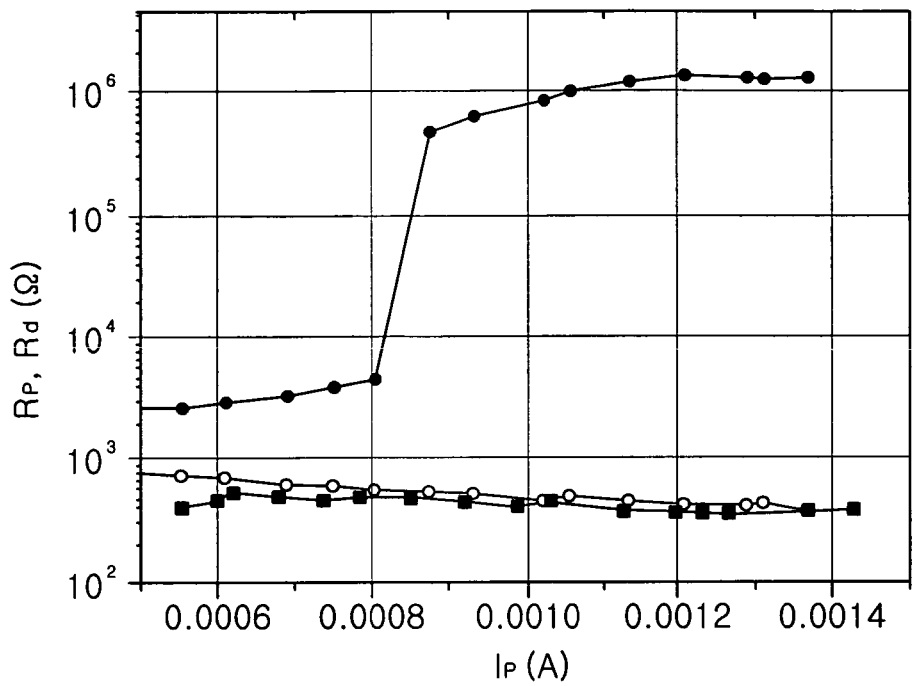
FIG. 9 is a graph illustrating a program resistance of a semiconductor device with respect to a pulse current, which is determined according to an embodiment of the present invention.

FIG. 9 is a graph illustrating a program resistance of a semiconductor device with respect to a pulse current, which is determined according to an embodiment of the present invention. In particular, FIG. 9 illustrates the program resistance $R_p$ (●) and the dynamic resistance $R_d$ (○, ■) versus the pulse current $I_p$. The semiconductor resistance device 50 is, for example, a PRAM. As the pulse current $I_p$ increases, the phases in the semiconductor resistance device 50 changes from a crystalline to an amorphous state and the program resistances $R_p$ (●) sharply increase when the pulse current $I_p$ is around 0.8 mA. However, in the dynamic measuring stage, as the pulse current $I_p$ increases, the phases in the semiconductor resistance device 50 changes from a solid to a melted state, and thus the dynamic resistance $R_d$ (○, ■) decreases. The dynamic resistance $R_d$ (○, ■) has dynamic characteristics when a pulse voltage is applied, and thus can indicate information, such as the state of an interface between the semiconductor resistance device 50 and a lower electrode (not illustrated). For example, an increase of the dynamic resistance $R_d$ (○, ■) may indicate the generation of a high resistive material between the semiconductor resistance device 50 and the lower electrode.

Figure 10:
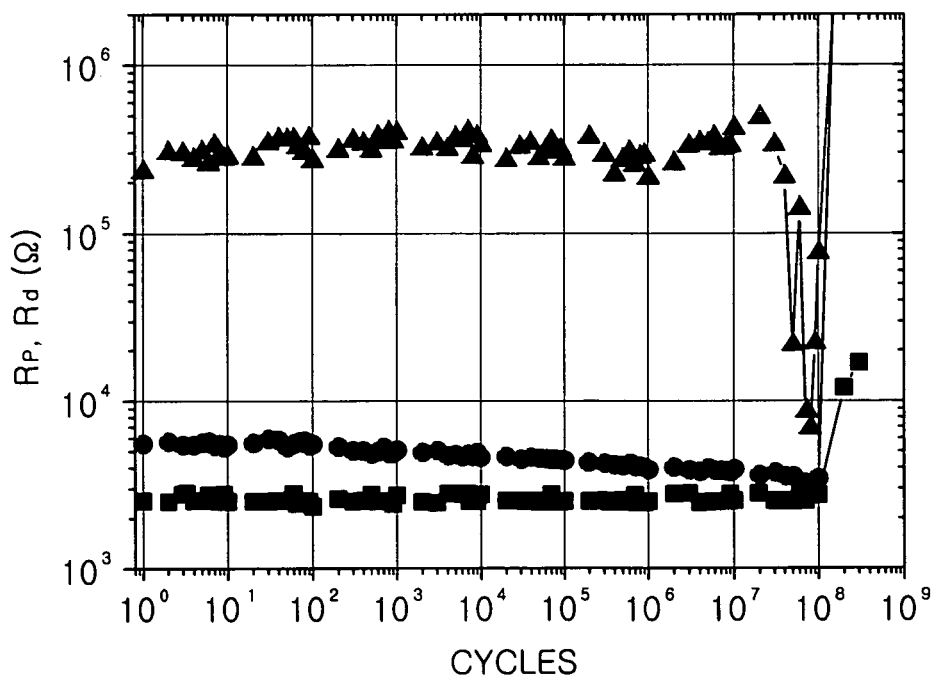
FIG. 10 shows results of iterative tests for determining pulse properties of a semiconductor device according to an embodiment of the present invention.

FIG. 10 shows results of iterative tests for determining pulse properties of a semiconductor device according to an embodiment of the present invention. Referring to FIG. 10, the program resistance $R_p$ (▲, ●) and the dynamic resistance $R_d$ (■) of the semiconductor resistance device 50 are constant up to about $10^7$ cycles. That is, compared to the results of the conventional system, which show different results in the iterative measurements, the systems 100 and 100' of determining pulse properties according to the present invention are more reliable.

Figure 8:
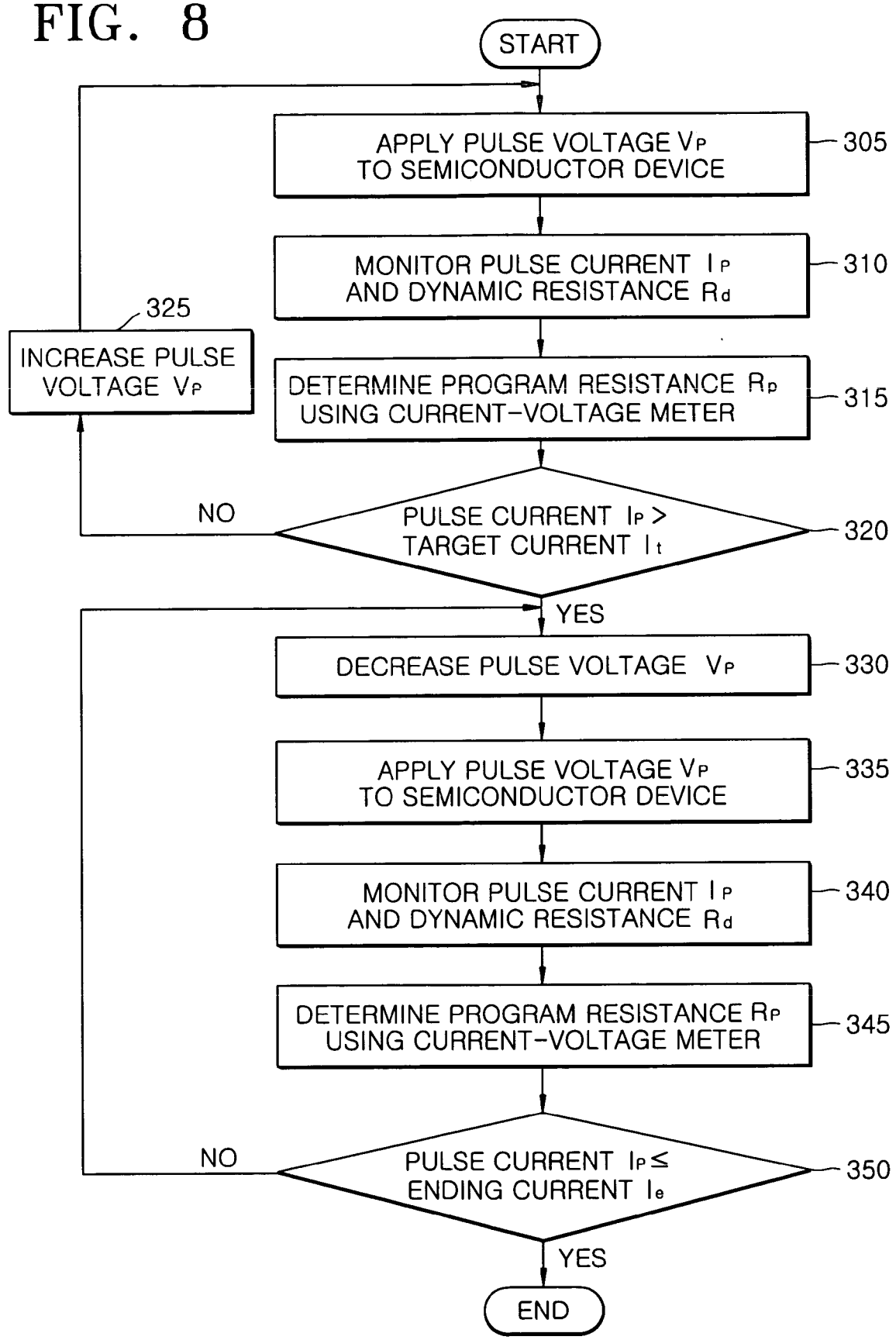
FIG. 8 is a flow chart illustrating a method of determining pulse properties of a semiconductor device according to another embodiment of the present invention.

FIG. 8 is a flow chart illustrating a method of determining pulse properties of a semiconductor device according to another embodiment of the present invention. In particular, FIG. 8 illustrates a feed-back method of determining pulse properties of the semiconductor resistance device 50 preventing over-programming. A pulse voltage $V_p$ is applied to a semiconductor resistance device 50 in operation 305. A pulse current $I_p$ and a dynamic resistance $R_d$ are determined in operation 310. A program resistance $R_p$ is determined by using the current-voltage meter 150 in operation 315.

Next, the pulse current is compared to a target current $I_t$ in operation 320. The target current can be experimentally determined and may be a maximum current that does not overstress the semiconductor resistance device 50. If $I_p \leq I_t$, the pulse voltage $V_p$ is increased in operation 325 and the above-described operations 305 through 320 are iterated. Otherwise, if $I_p > I_t$, the pulse voltage $V_p$ is decreased in operation 330 and the pulse voltage $V_p$ is applied to a semiconductor resistance device 50 in operation 335. The pulse current $I_p$ and the dynamic resistance $R_d$ are determined in operation 340. The program resistance $R_p$ is determined using the current-voltage meter in operation 345. Next, the pulse current $I_p$ is compared to an ending current $I_e$ in operation 350. If $I_p \leq I_e$, the measurement is stopped. Otherwise, if $I_p > I_e$, the above-described operations 330 through 350 are iterated.

In this method, the pulse voltage $V_p$ is increased while the pulse current $I_p$ is less than or equal to the target current $I_t$. On the other hand, when the pulse current $I_p$ is higher than the target current $I_t$, the pulse voltage $V_p$ is decreased until the pulse current $I_p$ is less than or equal to the ending current $I_e$.

Figure 11:
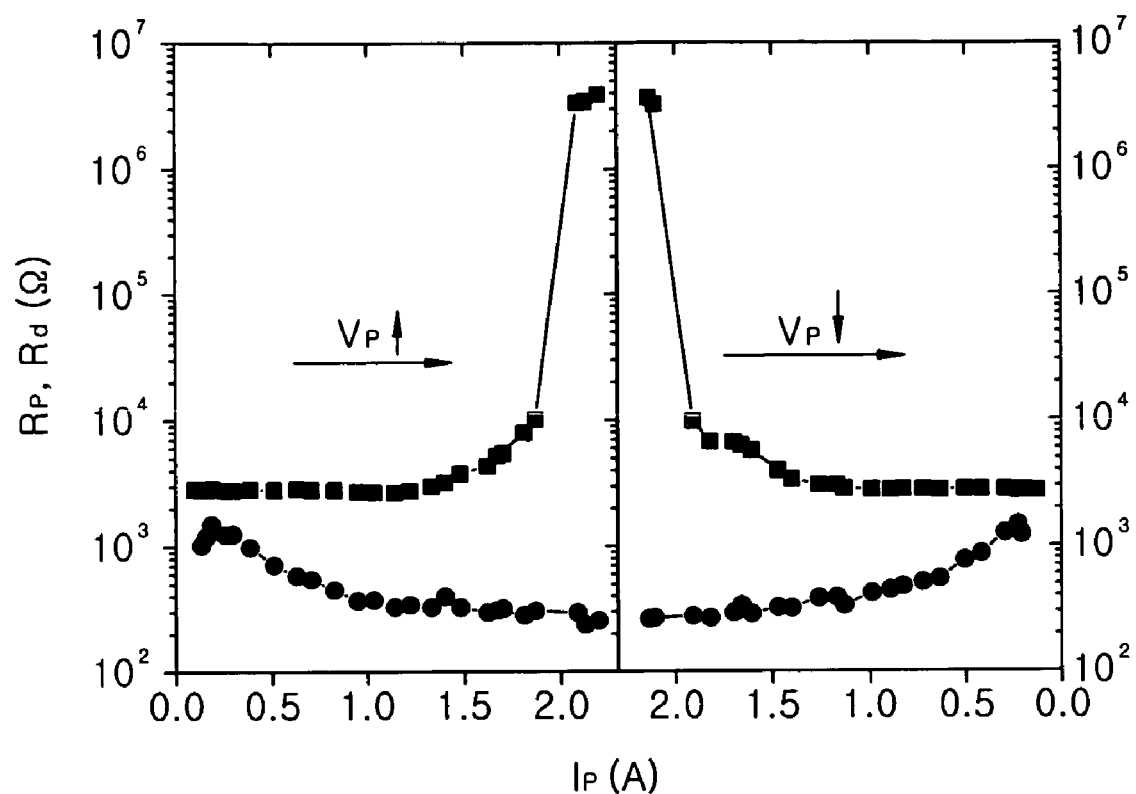
FIG. 11 shows pulse currents determined by a method of determining pulse properties of a semiconductor device according to an embodiment of the present invention.

FIG. 11 shows pulse currents determined by a method of determining pulse properties of a semiconductor device according to an embodiment of the present invention. Referring to FIG. 11, the pulse current increases to a maximum of about 2.25 mA, and then decreases. Accordingly, the pulse voltage $V_p$ can be controlled so as not to exceed its maximum limit by simultaneously determining the pulse current $I_p$. Consequently, the semiconductor resistance device 50 can be prevented from being over-stressed or damaged.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A system of determining pulse properties of a resistance random-access memory (RRAM) device, the system comprising:
    a first probe and a second probe electrically contacting terminals of the RRAM device;
    a pulse generator supplying a pulse electric signal to the first probe; and
    an oscilloscope having a first channel and a second channel, wherein the pulse electric signal is supplied to the first channel and the first probe, and the second channel is connected to the second probe,
    wherein the oscilloscope calculates a pulse current flowing through the terminals of the RRAM device using the second channel and determines a dynamic resistance of the RRAM device using the first and second channels.

2. The system of claim 1, wherein each of the first and second channels of the oscilloscope comprises an internal impedance and a voltage meter connected in parallel to the internal impedance.

3. The system of claim 1 further comprising:
    a current-voltage meter having a pair of first and second terminals respectively connected to the first and second probes for supplying a direct current (DC) electric signal; and
    a switch device configured to connect one of the current-voltage meter or the pulse generator to the first probe.

4. The system of claim 3, wherein the switch device includes a bias tee.

5. The system of claim 4, wherein the bias tee comprises a DC pass element passing a DC electric signal supplied by the current-voltage meter and an alternating current (AC) pass element passing a pulse electric signal supplied by the pulse generator.

6. The system of claim 3, wherein the switch device includes at least one RF switch.

7. The system of claim 6, wherein the RF switch is configured to connect one of a first terminal of the current-voltage meter or a first terminal of the pulse generator to the first probe.

8. A system of determining pulse properties of a resistance random-access memory (RRAM) device, the system comprising:
    a first probe and a second probe electrically contacting terminals of the RRAM device;
    a pulse generator supplying a pulse electric signal to the first probe;
    an oscilloscope having a first channel and a second channel, wherein the pulse electric signal is supplied to the first channel and the first probe, and the second channel is connected to the second probe;
    a current-voltage meter having a pair of first and second terminals respectively connected to the first and second probes for supplying a direct current (DC) electric signal; and
    a switch device configured to connect one of the current-voltage meter or the pulse generator to the first probe,
    wherein the oscilloscope calculates a pulse current flowing through the terminals of the RRAM device using the second channel and determines a dynamic resistance of the RRAM device using the first and second channels.

9. The system of claim 8, wherein each of the channels of the oscilloscope comprises an internal impedance and a voltage meter connected in parallel to the internal impedance.

10. The system of claim 8, wherein the switch device includes a bias tee.

11. The system of claim 10, wherein the bias tee comprises a DC pass element passing a DC electric signal supplied by the current-voltage meter and an alternating current (AC) pass element passing a pulse electric signal supplied by the pulse generator, the DC pass element is connected to the first terminal of the current-voltage meter, and the AC pass element is connected to the first probe and the pulse generator.

12. The system of claim 8, wherein the switch device includes at least one RF switch.

13. The system of claim 12, wherein the RF switch is configured to connect one of a first terminal of the current-voltage meter or a first terminal of the pulse generator to the first probe.

14. The system of claim 12, wherein the switch device comprises a pair of first and second RF switches, the first RF switch configured to connect one of the first terminal of the current-voltage meter or the first terminal of the pulse generator to the first probe, and the second RF switch configured to connect one of the second channel in the oscilloscope or ground to the second probe.

15. A method of determining pulse properties of a resistance random-access memory (RRAM) device using the system of claim 1, wherein the method comprises:
    applying a pulse voltage to the RRAM device using the pulse generator;
    monitoring a second voltage $V_2$ using the second channel in the oscilloscope; and
    calculating a pulse current $I_p$ flowing through the RRAM device from an internal impedance $Z_o$ of the oscilloscope and the second voltage $V_2$.

16. The method of claim 15, wherein $$I_p = V_2/Z_o.$$

17. The method of claim 15 further comprising monitoring a first voltage $V_1$ using the first channel in the oscilloscope after applying the pulse voltage, and calculating a dynamic resistance $R_d$ of the RRAM device after calculating the pulse current $I_p$.

18. The method of claim 17, wherein $$R_d = (V_1 - V_2)/I_p.$$

19. The method of claim 15 further comprising determining program resistance $R_p$ by connecting a current-voltage meter to the first and second probes after applying the pulse voltage.

20. The method of claim 15, further comprising comparing the pulse current $I_p$ and a threshold current $I_t$, the threshold current defined as a maximum current not damaging the RRAM device, wherein the pulse voltage is increased by a predetermined value and the pulse current $I_p$ is recalculated when $I_p \leq I_t$, and wherein the pulse voltage is decreased by a predetermined value and the pulse current $I_p$ is recalculated when $I_p > I_t$.

21. The method of claim 20, further comprising comparing the pulse current $I_p$ with an ending current $I_e$ after decreasing the pulse voltage and recalculating the pulse current, wherein the pulse voltage is further decreased by a predetermined value and the pulse current $I_p$ is recalculated when $I_p > I_e$, and wherein the measurement is stopped when $I_p \leq I_e$.

22. A method of determining pulse properties of a semiconductor resistance random-access memory (RRAM) device comprising:

applying a pulse voltage to the RRAM device using a pulse generator, wherein the pulse voltage is also applied to a first channel in an oscilloscope;

monitoring a second voltage using a second channel in the oscilloscope, wherein the second channel is connected to the RRAM device; and calculating a pulse current flowing through the RRAM device from an internal impedance of the oscilloscope and the second voltage.

23. The method of claim 22, wherein the pulse current is calculated by dividing the second voltage by the internal impedance of the oscilloscope.

24. The method of claim 22, further comprising monitoring a first voltage using the first channel in the oscilloscope after applying the pulse voltage, and calculating a dynamic resistance of the RRAM device after calculating the pulse current.

25. The method of claim 24, wherein the dynamic resistance is calculated by dividing the difference between the first and the second voltages by the pulse current.

26. The method of claim 22, further comprising comparing the pulse current $I_p$ and a threshold current $I_t$, the threshold current defined as a maximum current not damaging the RRAM device, wherein the pulse voltage is increased by a predetermined value and the pulse current $I_p$ is recalculated when $I_p \leq I_t$, and wherein the pulse voltage is decreased by a predetermined value and the pulse current $I_p$ is recalculated when $I_p \geq I_t$.

27. The method of claim 26, further comprising comparing the pulse current $I_p$ with an ending current $I_e$ after decreasing the pulse voltage and recalculating the pulse current, wherein the pulse voltage is further decreased by a predetermined value and the pulse current $I_p$ is recalculated when $I_p > I_e$, and wherein the measurement is stopped when $I_p \leq I_e$.

* * * * *